United States Patent
Cheng et al.

(10) Patent No.: US 6,922,049 B2
(45) Date of Patent: Jul. 26, 2005

(54) TESTING METHOD FOR A PRINTED CIRCUIT BOARD FORMED WITH CONDUCTIVE TRACES FOR HIGH-FREQUENCY DIFFERENTIAL SIGNAL TRANSMISSION

(75) Inventors: Yu-Chiang Cheng, Taipei (TW); Hsueh-Chin Liao, Taipei (TW)

(73) Assignee: Mitac International Corp., Hsinchu Hsien (TW)

( * ) Notice: Subject to any disclaimer, the term of this patent is extended or adjusted under 35 U.S.C. 154(b) by 0 days.

(21) Appl. No.: 10/358,879

(22) Filed: Feb. 4, 2003

(65) Prior Publication Data

US 2004/0150388 A1 Aug. 5, 2004

(51) Int. Cl.$^7$ ............................ G01R 1/04; G01R 31/26
(52) U.S. Cl. ..................................... 324/158.1; 324/765
(58) Field of Search ............................ 324/158.1, 763, 324/765; 716/12–17; 326/38–44

(56) References Cited

U.S. PATENT DOCUMENTS

| | | | | | |
|---|---|---|---|---|---|
| 5,295,082 A | * | 3/1994 | Chang et al. | ................ | 716/12 |
| 5,400,262 A | * | 3/1995 | Mohsen | ........................ | 326/41 |
| 5,544,069 A | * | 8/1996 | Mohsen | ........................ | 326/41 |
| 5,654,564 A | * | 8/1997 | Mohsen | ...................... | 257/209 |
| 5,661,409 A | * | 8/1997 | Mohsen | ...................... | 324/765 |
| 5,784,262 A | * | 7/1998 | Sherman | .................... | 361/777 |
| 5,973,340 A | * | 10/1999 | Mohsen | ...................... | 257/209 |

* cited by examiner

Primary Examiner—Jermele M. Hollington
(74) Attorney, Agent, or Firm—Merchant & Gould P.C.

(57) ABSTRACT

A testing method is provided for a printed circuit board that includes a board body formed with first and second conductive traces thereon. The first and second conductive traces are configured for transmitting a high-frequency differential signal and have segments parallel to each other. Each of the segments has an inner edge proximate to the segment of the other of the first and second conductive traces, and an outer edge distal from the segment of the other of the first and second conductive traces. Each of a pair of conductive pads formed on the printed circuit board is disposed proximate to and is connected electrically to the outer edge of the segment of a respective one of the first and second conductive traces.

8 Claims, 2 Drawing Sheets

TESTING METHOD FOR A PRINTED CIRCUIT BOARD FORMED WITH CONDUCTIVE TRACES FOR HIGH-FREQUENCY DIFFERENTIAL SIGNAL TRANSMISSION

BACKGROUND OF THE INVENTION

1. Field of the Invention

The invention relates to a testing method for a printed circuit board, more particularly to a testing method for a printed circuit board formed with conductive traces for high-frequency differential signal transmission.

2. Description of the Related Art

In order to process accurately a differential operation between positive and negative differential signals, the differential signals should be transmitted to a parallel and proximate pair of conductive traces. When the conductive traces are in close proximity, a high common-mode rejection ratio can be obtained. In addition, signal reflection can be eliminated and noise in a common-mode rejection can be effectively coupled. Therefore, in designing a printed circuit board, conductive traces are arranged in parallel and in close proximity on the printed circuit board. As such, undistorted differential signals can be maintained and electromagnetic interference can be minimized. However, to ensure product quality, conductive pads are formed on the printed circuit board for testing purposes.

FIG. 1 illustrates a conventional testing method for a punted circuit board 1. The printed circuit board 1 is formed with first and second conductive traces 11, 12 thereon. The conductive traces 11, 12 are configured for transmitting differential signals and have segments 111, 121. At a point along the length of each of the segments 111, 121 of the first and second conductive traces 11, 12, there is a bent section 13, 14 to accommodate conveniently a pair of test probes of a test equipment. Conductive pads 15, 16 are disposed and connected electrically and respectively to the bent sections 13, 14 in the segments 111, 121 of the first and second conductive traces 11, 12. However, since a uniform distance is not maintained between the segments 111, 121 of the first and second conductive traces 11, 12 as a result of the bent section 13, 14, electromagnetic field that causes electromagnetic interference can hardly be eliminated. In addition, since the common-made rejection ratio is reduced, noise that appears at the input cannot be effectively coupled. These result in distorted differential signals and inaccurate differential operation.

SUMMARY OF THE INVENTION

Therefore, the object of the present invention is to provide a testing method for high-frequency differential signals so as to overcome the aforesaid drawbacks of the prior art.

According to the present invention, a testing method for a printed circuit board comprises the step of forming a pair of conductive pads on the printed circuit board. The printed circuit board is formed with first and second conductive traces thereon. The first and second conductive traces are configured for transmitting a high-frequency differential signal and have segments parallel to each other. Each of the segments has an inner edge proximate to the segment of the other of the first and second conductive traces, and an outer edge distal from the segment of the other of the first and second conductive traces. Each of the conductive pads is disposed proximate to and is connected electrically to the outer edge of the segment of a respective one of the first and second conductive traces. Accordingly, a uniform distance between the inner edges of the segments of the first and second conductive traces can be maintained.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
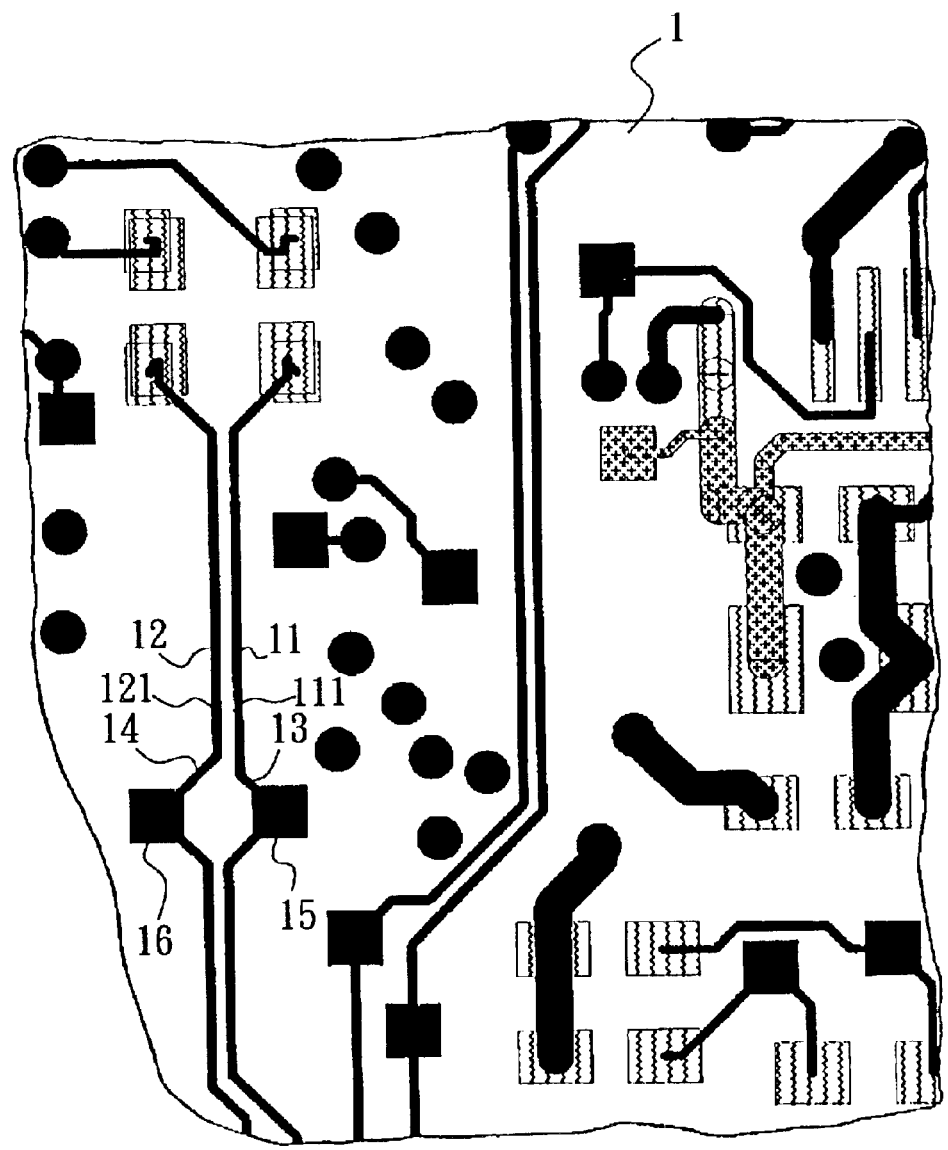
FIG. 1 illustrates a conventional testing method for a printed circuit board.
Figure 2:
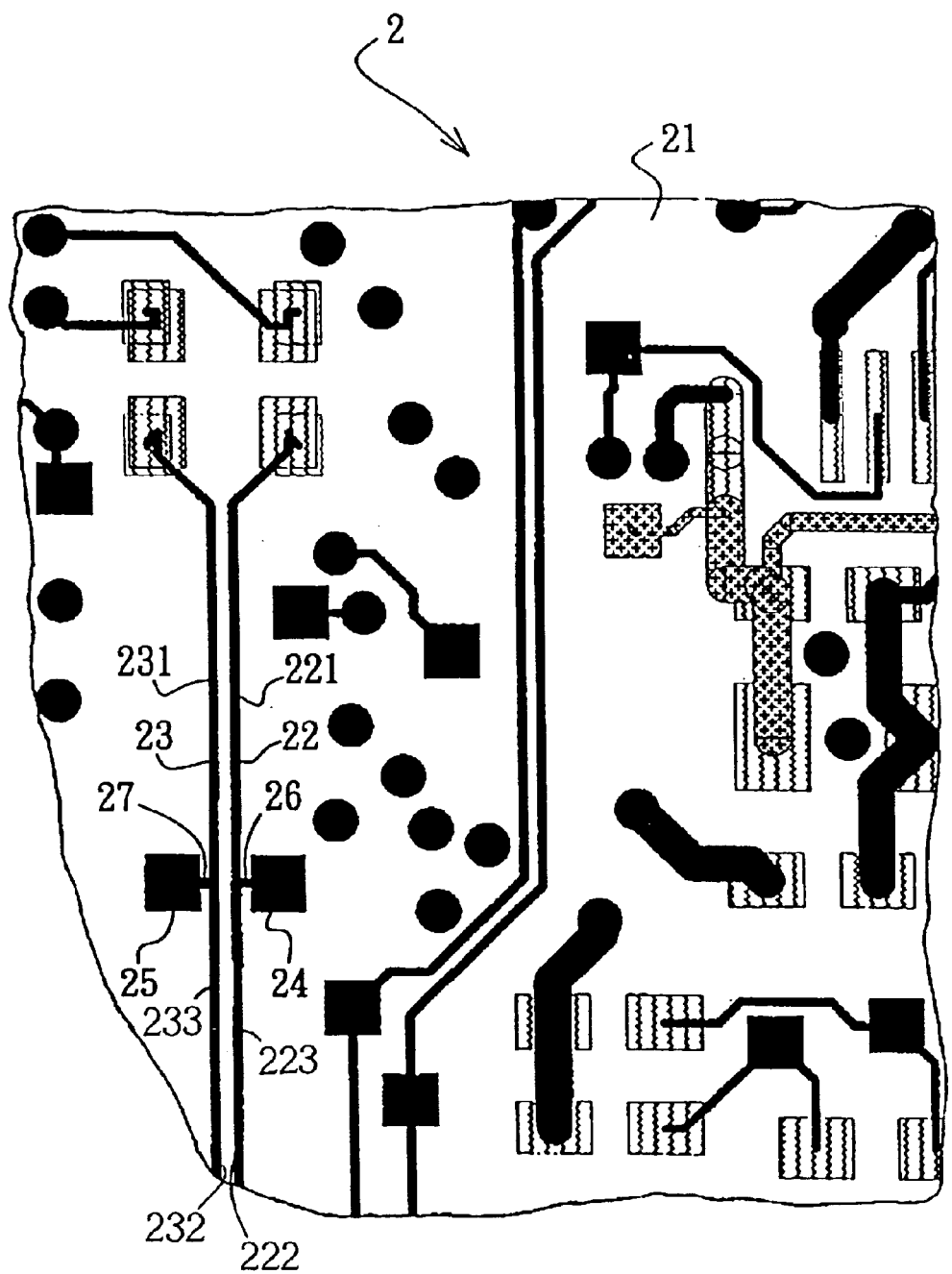
FIG. 2 is a fragmentary schematic view illustrating a printed circuit board used in the preferred embodiment of a testing method according to the present invention.

Referring to FIG. 2, in the preferred embodiment of a testing method for a printed circuit board 2 according to this invention, a pair of conductive pads 24, 25 are formed on a board body 21 of the printed circuit board 2.

The board body 21 is formed with first and second conductive traces 22, 23 thereon. The first and second conductive traces 22, 23 are configured for transmitting a high-frequency differential signal and have segments 221, 231 parallel to each other. Each of the segments 221, 231 has an inner edge 222, 232 proximate to the segment 231, 221 of the other of the first and second conductive traces 22, 23, and an outer edge 223, 233 distal from the segment 231, 221 of the other of the first and second conductive traces 22, 23. Each of the conductive pads 24, 25 is disposed proximate to and is connected electrically to the outer edge of the segment 221, 231 of a respective one of the first and second conductive traces 22, 23. As a result, a uniform distance between the inner edges of the segments 221, 231 of the first and second conductive traces 22, 23 can be maintained. The distance between the conductive pads 24, 25 and the segments 221, 231 of the first and second conductive traces 22, 23 is defined so as to conveniently accommodate a pair of test probes of a test equipment (not shown). The conductive pads 24, 25 serve as test points for high-frequency differential signals.

In this embodiment, the conductive pads 24, 25 are aligned with each other in a direction transverse to the segments 221, 231 of the first and second conductive traces 22, 23. Preferably, each of the conductive pads 24, 25 is connected to the outer edge of the segment 221, 231 of the respective one of the first and second conductive traces 22, 23 by a respective connecting trace 26, 27 that extends in the direction transverse to the segments 221, 231 of the first and second conductive traces 22, 23. Alternatively, each of the conductive pads 24, 25 can be connected directly to the outer edge of the segment 221, 231 of the respective one of the first and second conductive traces 22, 23.

It is evident from the above description that the printed circuit board 2 comprises aboard body 21, first and second conductive traces 22, 23 formed on the board body 21 and having segments 221, 231 parallel to each other, and a pair of conductive pads 24, 25 disposed proximate to and connected electrically and respectively to the first and second conductive traces 22, 23 at the outer edges of the segments 221, 231. The arrangement as such maintains a uniform distance between the inner edges of the segments 221, 231 of the first and second conductive traces 22, 23. Accordingly, the aforesaid drawbacks of the prior art can be overcome.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A testing method for a printed circuit board, said testing method comprising:
   (A) forming first and second conductive traces on a board body of the printed circuit board, the first and second conductive traces being configured for transmitting a high-frequency differential signal and having segments parallel to each other, each of the segments having opposite first and second ends, an inner edge extending continuously between the first and second ends of a respective one of the segments and that is proximate to the segment of the other of the first and second conductive traces, and an outer edge extending continuously between the first and second ends of the respective one of the segments and that is distal from the segment of the other of the first and second conductive traces, the inner edges of the segments of the first and second conductive traces having a uniform distance maintained therebetween; and
   (B) forming a pair of conductive pads on the board body of the printed circuit board, each of the conductive pads being disposed between the first and second ends of a respective one of the segments, and being disposed proximate to and being connected electrically to the outer edge of the respective one of the segments.

2. The testing method as claimed in claim 1, wherein the conductive pads are aligned with each other in a direction transverse to the segments of the first and second conductive traces.

3. The testing method as claimed in claim 1, wherein each of the conductive pads is connected to the outer edge of the segment of the respective one of the first and second conductive traces by a respective connecting trace that extends in a direction transverse to the segments of the first and second conductive traces.

4. The testing method as claimed in claim 3, wherein the conductive pads are aligned with each other in the direction transverse to the segments of the first and second conductive traces.

5. A printed circuit board comprising:

a board body;

first and second conductive traces formed on said board body, said first and second conductive traces being configured for transmitting a high-frequency differential signal and having segments parallel to each other, each of said segments having opposite first and second ends, an inner edge extending continuously between said first and second ends of a respective one of said segments and that is proximate to said segment of the other of said first and second conductive traces, and an outer edge extending continuously between said first and second ends of the respective one of said segments and that is distal from said segment of the other of said first and second conductive traces, said inner edges of said segments of said first and second conductive traces having a uniform distance maintained therebetween; and a pair of conductive pads formed on said board body, each of said conductive pads being disposed between the first and second ends of a respective one of said segments, and being disposed proximate to and being connected electrically to said outer edge of the respective one of said segments.

6. The printed circuit board as claimed in claim 5, wherein said conductive pads are aligned with each other in a direction transverse to said segments of said first and second conductive traces.

7. The printed circuit board as claimed in claim 5, further comprising a pair of connecting traces, each of which connects a corresponding one of said conductive pads to said outer edge of said segment of the respective one of said first and second conductive traces and extends in a direction transverse to said segments of said first and second conductive traces.

8. The printed circuit board as claimed in claim 7, wherein said conductive pads are aligned with each other in the direction transverse to said segments of said first and second conductive traces.

* * * * *